(12) United States Patent
Edmonston et al.

(10) Patent No.: US 8,032,801 B2
(45) Date of Patent: *Oct. 4, 2011

(54) HIGH SPREAD HIGHLY RANDOMIZED GENERATABLE INTERLEAVERS

(75) Inventors: Brian S. Edmonston, Carlsbad, CA (US); Paul K. Gray, Hackney (AU)

(73) Assignee: Broadcom Corporation, Irvine, CA (US)

( * ) Notice: Subject to any disclaimer, the term of this patent is extended or adjusted under 35 U.S.C. 154(b) by 951 days.

This patent is subject to a terminal disclaimer.

(21) Appl. No.: 11/715,598

(22) Filed: Mar. 7, 2007

(65) Prior Publication Data

US 2007/0234180 A1 Oct. 4, 2007

Related U.S. Application Data

(60) Continuation of application No. 10/934,847, filed on Sep. 3, 2004, now Pat. No. 7,302,621, which is a continuation-in-part of application No. 10/285,262, filed on Oct. 30, 2002, now Pat. No. 6,789,218, which is a division of application No. 09/742,248, filed on Dec. 20, 2000, now Pat. No. 6,775,800.

(60) Provisional application No. 60/174,298, filed on Jan. 3, 2000, provisional application No. 60/174,290, filed on Jan. 3, 2000.

(51) Int. Cl.
*G06F 11/00* (2006.01)

(52) U.S. Cl. .......................................... 714/701; 714/755

(58) Field of Classification Search ................... 714/701, 714/755

See application file for complete search history.

(56) References Cited

U.S. PATENT DOCUMENTS

| 4,023,023 | A | * | 5/1977 | Bourrez et al. ............... 708/490 |
| 5,056,105 | A | | 10/1991 | Darmon et al. |
| 5,136,588 | A | | 8/1992 | Ishijima |
| 5,293,607 | A | | 3/1994 | Brockmann et al. |
| 5,377,340 | A | | 12/1994 | Seroussi et al. |
| 5,446,747 | A | | 8/1995 | Berrou |
| 5,530,837 | A | | 6/1996 | Williams et al. |

(Continued)

FOREIGN PATENT DOCUMENTS

EP  1030455  8/2000

(Continued)

OTHER PUBLICATIONS

Dawid, et al., "Map Channel Decoding: Algorithm and VLSI Architecture", VLSI Signal Processing, Proceedings IEEE wol 6, No. VI, Oct. 1993, pp. 141-149.

(Continued)

*Primary Examiner* — M. Mujtaba Chaudry
(74) *Attorney, Agent, or Firm* — McAndrews, Held & Malloy, Ltd.

(57) ABSTRACT

Methods and apparatus for generating and performing digital communications using a randomized generatable interleaver. In accordance with one exemplary embodiment of the invention, a pseudo random interleaver of size n*m with excellent randomness and spread properties may be generated from a set of seed values. The interleaver of size $N=n*m$ is defined by dividing the N possible address in the interleaver (0–N–1) into n subsets. The subsets are preferably generatable from a single value within the subset either using an algorithm or a memory based lookup table. The set of n seeds comprises one value selected from each subset. An improved communication system incorporating the aforementioned interleaver and using turbo codes or other concatenated coding systems is also disclosed.

12 Claims, 10 Drawing Sheets

U.S. PATENT DOCUMENTS

| | | | |
|---|---|---|---|
| 5,535,220 A | 7/1996 | Kanno et al. | |
| 5,652,861 A | 7/1997 | Mayo et al. | |
| 5,671,392 A | 9/1997 | Parris et al. | |
| 5,924,111 A | 7/1999 | Huang et al. | |
| 5,950,220 A * | 9/1999 | Quach | 711/5 |
| 6,035,434 A | 3/2000 | Sazzad et al. | |
| 6,323,788 B1 | 11/2001 | Kim et al. | |
| 6,339,834 B1 | 1/2002 | Crozier et al. | |
| 6,381,728 B1 | 4/2002 | Kang | |
| 6,434,203 B1 | 8/2002 | Halter | |
| 6,590,951 B1 | 7/2003 | Kim et al. | |
| 6,591,381 B1 | 7/2003 | Kim et al. | |
| 6,598,202 B1 | 7/2003 | Kim et al. | |
| 6,603,412 B2 * | 8/2003 | Gatherer et al. | 341/61 |
| 6,668,343 B1 * | 12/2003 | Kim et al. | 714/702 |
| 7,020,827 B2 * | 3/2006 | Gatherer et al. | 714/786 |
| 7,715,503 B2 * | 5/2010 | Cameron et al. | 375/340 |

FOREIGN PATENT DOCUMENTS

| | | |
|---|---|---|
| FR | 2 737 363 A | 1/1997 |
| WO | WO 98 43168 A | 10/1998 |
| WO | WO 00 27037 A | 5/2000 |
| WO | WO 00 60750 A | 10/2000 |

OTHER PUBLICATIONS

Benedetto, et al., "Soft-Output Decoding Algorithms for Continuous Decoding of Parallel Concatenated Convolutional Codes", IEEE International conference on Communications, Jun. 1996, pp. 112-117.

Hsu, et al., "A Parallel Decoding Scheme for Turbo Codes", IEEE International Symposium on Circuits and Systems, May 1998, pp. 445-448.

* cited by examiner ately, the present invention improves decoding speed over existing decoders by enabling decoding operations to take place in parallel.

HIGH SPREAD HIGHLY RANDOMIZED GENERATABLE INTERLEAVERS

PRIORITY AND CROSS-REFERENCE TO RELATED APPLICATIONS

The present invention is a continuation of U.S. application Ser. No. 10/934,847 (now U.S. Pat. No. 7,302,621), filed on Sep. 3, 2004, which is a continuation-in-part of U.S. application Ser. No. 10/285,262 (now U.S. Pat. No. 6,789,218), filed Oct. 30, 2002, which is a divisional U.S. application Ser. No. 09/742,248 (now U.S. Pat. No. 6,775,800), filed Dec. 20, 2000, which claims priority to provisional U.S. Application Ser. No. 60/174,298, filed Jan. 3, 2000, and provisional U.S. Application Ser. No. 60/174,290, filed Jan. 3, 2000.

FIELD OF THE INVENTION

The present invention is related to the field of digital communications. More particularly, the present invention is a method and apparatus for, inter alia, conducting digital communications using a generatable pseudo random interleaver.

DESCRIPTION OF RELATED TECHNOLOGY

Turbo coding is a recently developed forward error correction coding and decoding technique that provides previously unavailable error correction performance. A general description of a parallel turbo code can be found in U.S. Pat. No. 5,446,747 entitled "Error-correction Coding Method With at Least Two Systematic Convolution Codings in Parallel, Corresponding Iterative Decoding Method, Decoding Module and Decoder," filed Apr. 16, 1992 assigned to France Telecom and incorporated herein by reference. The enhanced level of error correction provided by turbo codes facilitates the transmission of data over noisy channels, thereby improving the data transmission capability of all sorts of communications systems.

Some characteristics of turbo codes combine to make the associated decoders more difficult to implement in an integrated circuit. These characteristics include large frame sizes, the use of repeated decoding steps that incorporate extrinsic information, and the use of a pseudo random interleaver for generating interleaved versions of the transmitted information and extrinsic information used during encoding and decoding. Additionally, many turbo-coding schemes require a sufficiently high degree of randomness in the psuedo random interleaver that the data sequence must be stored in memory rather than calculated on the fly.

This combination of characteristics causes turbo codes to require, in general, greater processing resources than other forward error correction coding techniques. For example, the use of repeated decoding steps increases the decoding time. The (typically) large frame size combined with the use of extrinsic information during decoding increases the amount of memory required to implement a decoder.

Additionally, the use of a pseudo random interleaver complicates the ability to decode a frame in parallel because extrinsic and sample information can not be accessed in an orderly fashion. Memory requirements are further increased by the use of memory based interleavers, which are preferred when turbo codes having the best performance are required. The use of memory based-interleavers can also reduce the speed of the decoder since the interleaver typically has to be accessed twice during a decoding subiteration. This limits the possible decoding speed to half the memory access rate, which is often much slower than the rate of other available circuits.

In the paper, S. Crozier, *"New High-Spread High-Distance Interleavers for Turbo Codes"*, 20-th biennial Symposium on Communications (Kingston, Canada, May 2000), pp. 3-7, various high spread pseudo random interleavers are described, including a high-spread random interleaver as well as a "dithered-diagonal" interleaver. These interleavers provide excellent "spreading" properties while also maintaining sufficient randomness to provide good performance when incorporated into a turbo decoder.

One interleaver described in the paper is a high spread random interleaver. The high spread interleaver is generated by randomly generating real numbers, applying a spread test, and then rejecting those numbers that do not pass the spread test. Finally, a sorting step is performed. The resulting interleaver provides excellent performance when used in a turbo code, but cannot be generated in real time on an integrated circuit due in part to the sorting step. Because these interleavers cannot be generated in real time, they typically must be stored in memory consuming large amounts of chip area.

The paper also describes a dithered-diagonal interleaver including a number of variations. In the most general variation, interleaver generation requires dithering a set of diagonal lines and then enclosing a block K of these dithered values. The resulting values are sorted to determine integer read and write indexes.

While the dithered-diagonal interleavers also provide good spreading and randomness properties, in their most general form, dithered-diagonal interleavers can not be generated on the fly. Thus, the dithered diagonal interleaver also requires substantial circuit area for real time implementation on an integrated circuit.

The above referenced paper does describe one generatable variation of the dithered diagonal interleaver, (referred to herein as the "generatable dithered diagonal" (GDD) interleaver). However, in order to make the interleaver generatable, the GDD interleaver places some restrictions on the size of the interleaver and the dithering that can be performed.

These restrictions significantly reduce the performance and usefulness of this interleaver in a turbo code because the restrictions significantly reduce the randomness property of the interleaver. The performance reduction worsens as the size the interleaver increases.

Thus, while the paper sets forth many very useful interleavers, it does not supply a highly flexible, readily generatable interleaver that has performance in a turbo code comparable to the state of the art non-generatable interleavers.

The types of systems that can benefit from the use of Turbo Codes include packet based local area networking (LAN) systems. This is particularly true where the transmission media is noisy or imperfect including RF signal transmitted in the open or via a noisy medium such as power lines. Thus, it would be useful to have a Turbo Code with packet sizes that supported typical LAN communications, as well as video and audio packets.

SUMMARY OF THE INVENTION

The present invention is directed to providing a decoding circuit that minimizes the negative effect the above described characteristics have on performance and cost, thereby increasing the number of applications for which turbo codes may be used in a practical and economic manner. Additionally, the present invention is directed to a turbo decoder architecture that provides broadband using a practical amount of circuitry and memory.

In another aspect of the invention, a method and apparatus for generating and performing digital communications using a randomized generatable interleaver is described. In accordance with one embodiment of the invention, a pseudo random interleaver of size n*m with excellent randomness and spread properties may be generated form set a set of seed values.

In one exemplary embodiment, the interleaver of size N=n*m is defined by, dividing the N possible address in the interleaver (0–N−1) into n subsets. The subsets are preferably generatable from a single value within the subset either using an algorithm or a memory based lookup table. To select the set of n seeds one value from each subset is selected.

The interleaver is preferably employed in a communication system incorporating the use of turbo codes or other concatenated coding systems incorporated the use of pseudo-random interleavers such as serial concatenated codes or hybrids.

Embodiments of the invention that include interleavers of size 2304, 2080 and 64 addresses are provided.

DETAILED DESCRIPTION OF THE INVENTION

Figure 1:
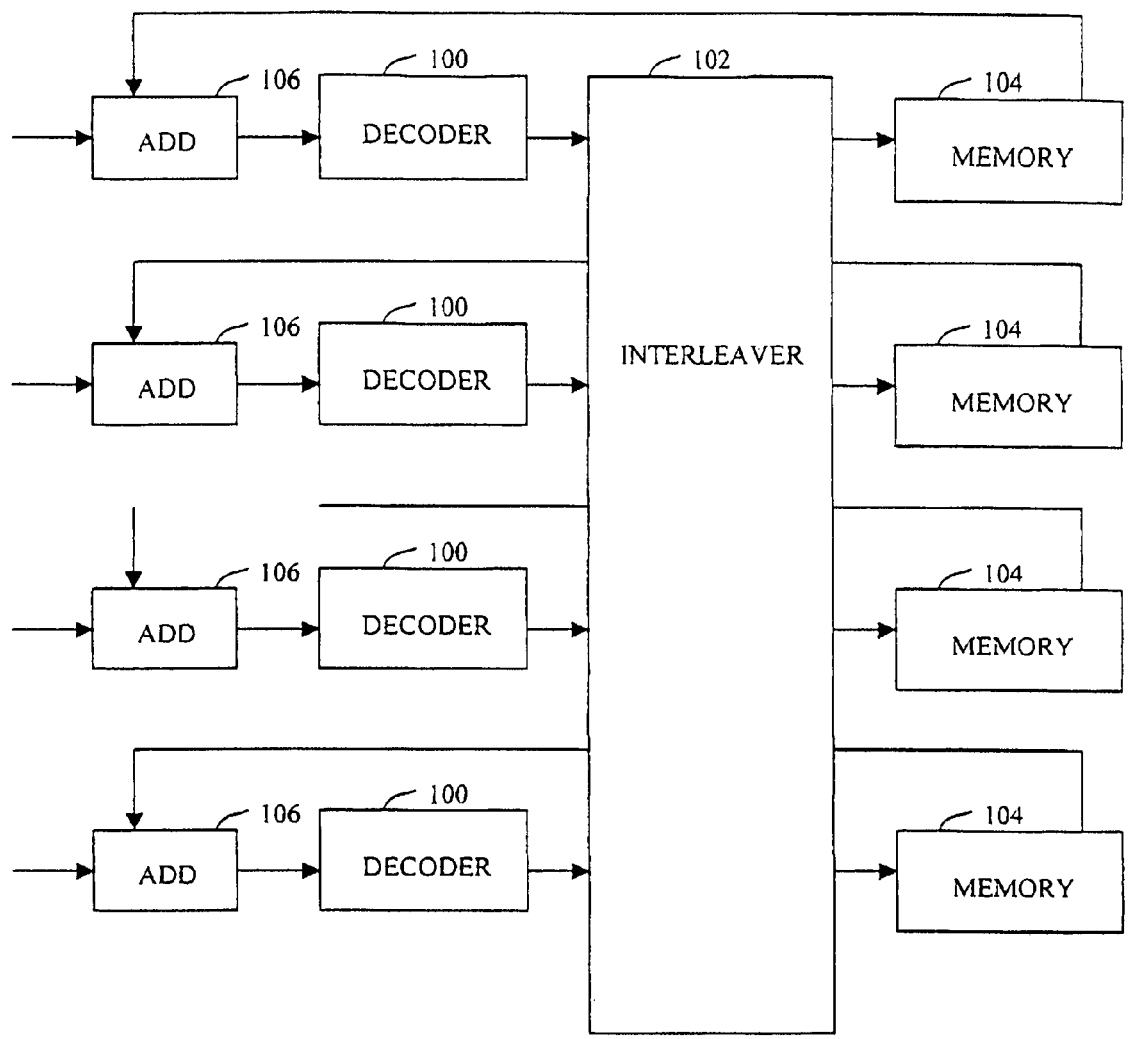
FIG. 1 is a block diagram that illustrates a fundamental operation performed when doing iterative decoding.

FIG. 1 is a block diagram that illustrates a fundamental operation performed when doing iterative decoding. During decoding, receive samples are processed through add circuits 106 and decoder circuits 100. Decoder circuits are preferably soft-in-soft-out (SISO) decoders such as MAP decoders that perform the maximum a posteriori decoding algorithm.

To speed up processing each decoder 100 processes a portion of the frame simultaneously, or in parallel. The output of the decoders is passed to an interleaver 102 (which could also be a deinterleaver). Interleaver 102 reroutes the data to a set of memory banks 104. Once all the data is processed a second iteration is performed using the receive samples as well as the data stored in memory banks 104.

The performance of the above described decoder is adversely impacted by the use of interleaver 102, however. In particular, the interleaving pattern will often require that the output of two or more decoders to be written to the same memory 104. Because the memory can only receive one value at any given time, the one decoder must be stalled, or the value stored, until the memory become available. This delays the speed at which decoding can be done, and reduces the benefit of using multiple decoders in parallel. Where such delay can be avoided it would be advantageous.

A system and method for high efficiency high performance processing of turbo codes is described. In accordance with one embodiment of the invention, an interleaver for interleaving code symbols is provided, the interleaver having a plurality of subsections, each subsection having a set of addresses and each address having an index, wherein a substantially constant relationship exists from any one subsection to any other subsection between the index of each address at a particular location. In a second embodiment of the invention, a forward error correction decoder has a plurality of memory elements, each for storing data associated with a valid index value, a plurality of decoders, each for decoding a subsection from said interleaver, and M interleaver subsections, where said M interleaver subsections each have addresses and said addresses are generated in sets of n values separated by a value SET_STEP, and wherein each subsection is comprised of r sets of n values, where r is an integer multiple of M.

Figure 2:
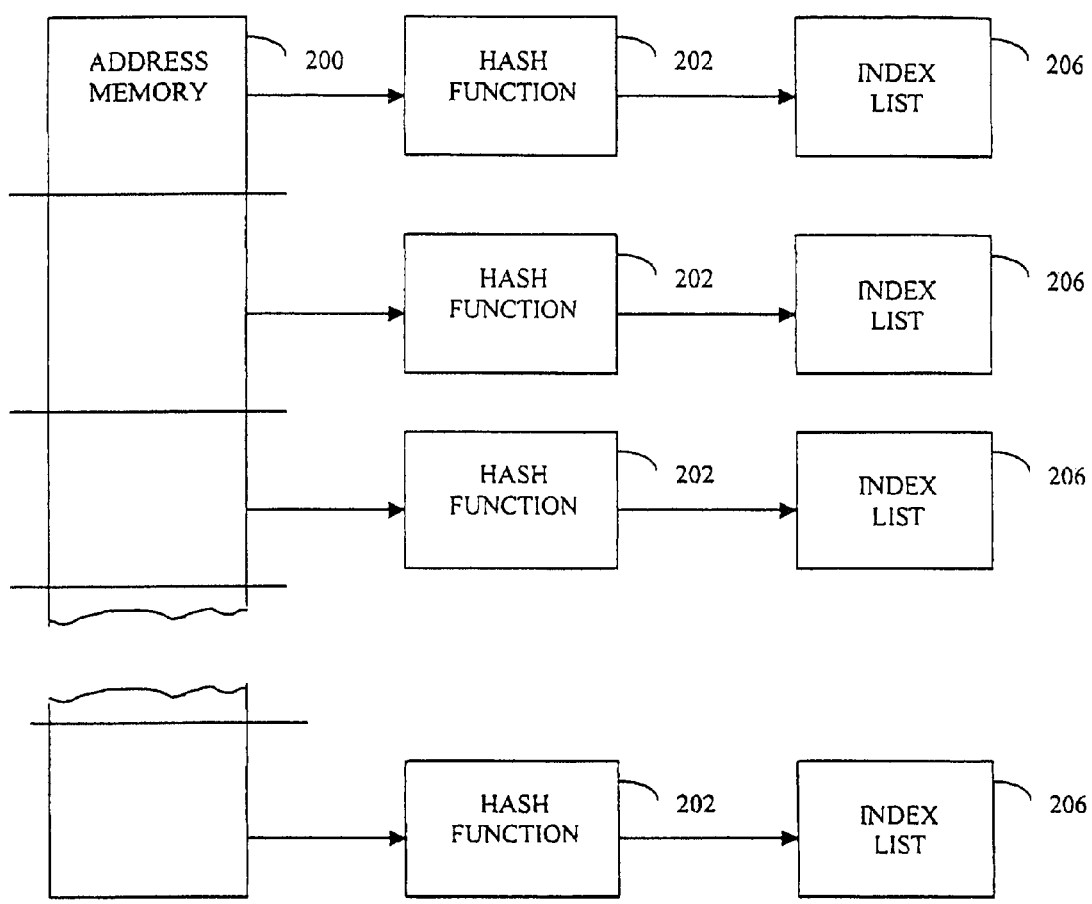
FIG. 2 is a block diagram illustrating an interleaver configured in accordance with one embodiment of the invention.

FIG. 2 is a block diagram illustrating an interleaver configured in accordance with one embodiment of the invention. Address memory 200 contains the set of addresses that define the interleaver. The interleaver address space is divided into subsections that correspond to the portions of the frame that will be decoded by a particular decoder.

Hash functions 202 receive the addresses and generate a hash index value based on the address. In one embodiment of the invention, the hash index is used to determine the particular memory to which the data value will be written. So the number of possible hash index values is preferably the same as the number of memories 104.

The application of the hash function 202 to each subset of address produces an index list (206). In accordance with one embodiment of the invention, the interleaver addresses are selected such that the index for the set of addresses at a particular location with the subset will be different for each subsection. Thus, as decoding is performed, each decoder will be writing to a different memory bank 104, and therefore no memory contention will take place. This will allow the decoder to take full advantage of the multiple MAP decoders.

Various alternative address selections can be performed. For example, the addresses can be chosen simply so that the index lists for each subsection has a constant relationship between indexes at the same location. Writing to the memory banks can then be "pipelined" so that substantially all of the benefit of the multiple decoder can be realized.

In an exemplary embodiment, the hash function can merely select the four least significant bits of the address as the hash index. Thus, the addresses are chosen so that the addresses in a particular location within the subsection have a unique four least significant bits when compared to the other addresses in the other subsections. An interleaver with this characteristic can be generated simply by sorting an existing interleaver based on the index selection criteria.

If values are left over after the sort, they can be inserted at the beginning of the interleaver and another sort performed. Typically a fully indexed interleaver with reasonable randomness can be arrived at after a reasonable number of sort in this fashion.

It should also be noted that some relative prime interleavers also have characteristic of being full indexed.

An alternative hash function is simply to divide the address by the size of the subsection. While the division operation is more computationally intensive, this organizes the memory into one large virtual memory, which facilitates read and writing to the memory during iterations in which interleaving is not performed.

In accordance with another embodiment of the invention, a turbo code may be efficiently decoded using various generated interleavers with excellent spreading properties. Various embodiments of these interleavers are described subsequently herein with respect to FIGS. 7-9. These embodiment include, inter alia, interleavers generated by repeatedly adding an increment amount to an initial set of seed values. These interleavers provide excellent error correction performance with reduced memory requirements, and therefore are highly desirable. Thus, an embodiment of the present invention that incorporates these interleavers is highly desirable.

As noted above, many of the interleavers described subsequently herein are generated by repeatedly adding an increment amount to an initial set of seed values. In various different embodiments, the increment amount is referred to using different terms. For purposes of the following description, the increment amount is referred to as SET_STEP; however, it will be appreciated by those of ordinary skill that the applicability of the invention is not limited to those embodiments of the invention which also use the term SET_STEP, the foregoing being merely exemplary.

Figure 3:
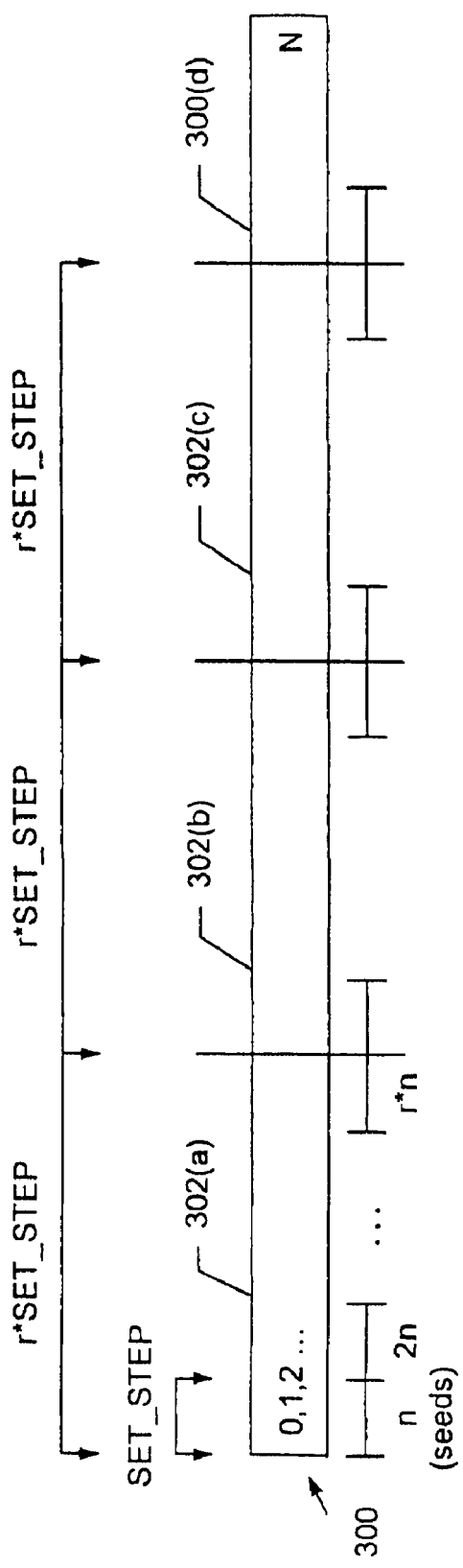
FIG. 3 is a diagram of a generated interleaver partitioned in accordance with one embodiment of the invention.

FIG. 3 is a diagram of a generated interleaver partitioned in accordance with one embodiment of the invention. The interleaver 300 contains addresses in locations 0, 1, 2 . . . N, that are used to permute data for encoding and decoding in a turbo code based forward error correction system. It should be noted, that the numbers 0, 1, 2 . . . N are merely the locations of the interleaver addresses, and not the interleaver addresses themselves.

In the described embodiment of the invention, the interleaver 300 is divided into M=4 subsection 302(a)-(d). An M of 4 is just used for example. Any alternative number of subsections M may be used. The four subsection preferably correspond to the number of decoding units (typically SISO decoders) that will be performing the decoding in parallel. Thus, in the described embodiment there are M interleaver subsections and M decoders operating in parallel.

Still referring to FIG. 3, the subsections 302 are further divided into windows of size n, where n is the number of seeds used to generate the interleaver. Typically, the first set of values in the interleaver are the seeds, which is denoted in FIG. 3.

As described in the above referenced patent, the addresses in the interleaver are then generated by adding a value SET_STEP to the set of n previous addresses. Thus, the second set of n addresses differ from the first set of n addresses by the amount SET_STEP. For example, the (n+1)th address will differ from the $1^{st}$ address by SET_STEP, and the (n+2)th address will difference from the $2^{nd}$ address by SET_STEP as well.

As illustrated, the subsections are comprised of a set of r*n addresses, where n is the size of the seed set, and r is an integer number that is an even multiple of M (where, as described above M, the number of decoder units). Alternatively, r can be a integer value that is relative prime to M.

Since the second subsection 302(b) begins r sets of n addresses after the first address, and each set of n addresses is different by SET_STEP from the previous set, the difference between first address of the first subset, and the first address in the second subset 302(b) is r*SET_STEP. Similarly, the difference between the second address of the first subset, and the second address in the second subset 302(b) is also r*SET_STEP.

This relationship extends between all the subsets 302. In particular, the $i^{th}$ value for any given subset, will be some multiple of r*SET_STEP from the $i^{th}$ value in another subset 302. Across all subsets, the $i^{th}$ value in any subset 302 will be some multiple q of r*SET_STEP, where q is between 1 and (M−1).

This relationship between the $i^{th}$ value of any subset 302 allows an index for a fully indexed interleaver to be established. Once the index has been established, the iterative decoding can be performed in a highly efficient parallel fashion as described herein.

In particular, by creating an index that is based on r*SET_STEP, it can be ensured that a fully parallel decoding can be performed with the performance benefit of the highly spread and generatable interleavers. This enables the implementation of turbo decoders that are high speed, high performance and high efficiency.

In accordance with one embodiment of the invention, the index is the address A is integer-divided by r*SET_STEP. A modulo M (% M) operation is then performed on the result, yielding the address index. That is, in one embodiment of the invention the index value is calculated as follows:

$$\text{Index} = \text{trunc}(A/r*\text{SET\_STEP}) \% M \qquad (1)$$

Where A is the address, trunc( ) removes the remainder of the divide operation, and % is a modulo operation.

In many cases, selecting the proper value for r will not allow the interleaver to be divided into M equal sized subsections. In one embodiment of the invention, this is dealt with by making the last subsection 302 shorter than the previous subsections (although preferably as close to the same as possible). This will cause one decoder and memory to not be used for a portion of the decoding subiteration, but the overall reduction in efficiency will be minimal if the shorter subsection is kept close in size to the other subsection, and in all cases the reduction in efficiency will be much less than if no indexing is used at all.

It should be understood that although this indexing represents a highly efficient and easy to implement way to take advantage of the regularity of the above described interleavers, other indexing methods for these types of interleavers may be employed in accordance with the invention. In general, the method described with respect to equation (1) is more generalized than other indexing methods may be.

For example, for certain size interleavers and certain values of SET_STEP, r*SET_STEP is equal to the number of bits in the subsection 302. In this case, the index may simply be set to the address divided by the size of the subsection (an embodiment already described above in more general terms). One example of an interleaver that meet this condition is the interleaver where m=2n, and the SET_STEP size is n, and resulting interleaver of size N can be divided evenly into M subsections.

Figure 4:
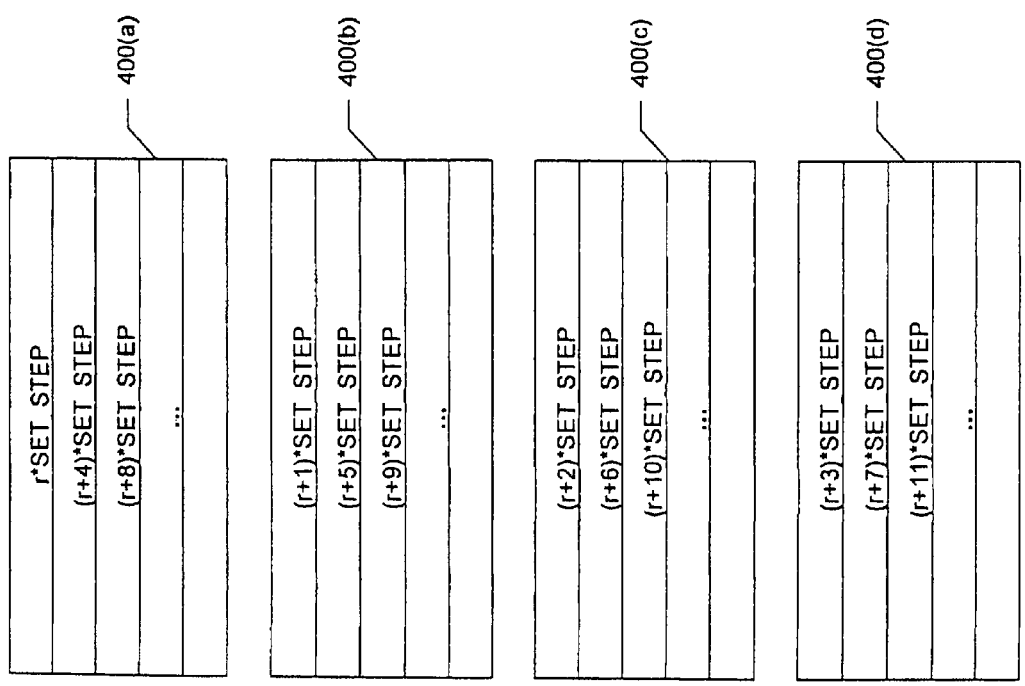
FIG. 4 is diagram illustrating the address placement within the M=4 memory banks in accordance with one embodiment of the invention.

FIG. 4 is diagram illustrating the address placement within the M=4 memory banks in accordance with one embodiment of the invention. Four extrinsic information memories 400 are shown in accordance with the use of 4 decoders.

Within memory 400, the information is placed according to the associated address. As illustrated, memory 400(a) contains information associated with the first r*SET_STEP addresses (from address 1 to address r*SET_STEP). Memory 400(b) contains information associated with the $2^{nd}$ set of r*SET_STEP addresses, memory 400(c) contains the information associated with the $3^{rd}$ set of r*SET_STEP addresses, and memory 400(*d*) contains the information associated with the 4$^{th}$ set of r*SET_STEP addresses.

More generally, memory 400(*a*) contains the information associated with (1+4p)r*SET_STEP sets of addresses, memory 400(*b*) contains the information associated with (2+4p)r*SET_STEP sets of addresses, memory 400(*c*) contains the information associated with (3+4p)r*SET_STEP sets of addresses, and memory 400(*d*) contains the information associated with (4+4p)r*SET_STEP sets of addresses, where p goes from 0 to the last set of r*SET_STEP of addresses within N.

More generally still, each memory contains addresses associated with a particular index value.

As should be apparent, by storing the information as shown in FIG. 4, the information necessary for the next decoding step performed by the M decoders will all be located in different memory banks since the i$^{th}$ value across all subsections will be separated from one another by the amount r*SET_STEP. Thus, the decoding can be performed completely in parallel without memory clashes.

As noted above, the calculation index calculations simplify significantly in an embodiment where the interleaver is size N n*m and m=2n, each memory simply stores the a set of N/M addresses (where M divides evenly into M). Thus the index is the address N divided by the subsection length M.

Figure 5:
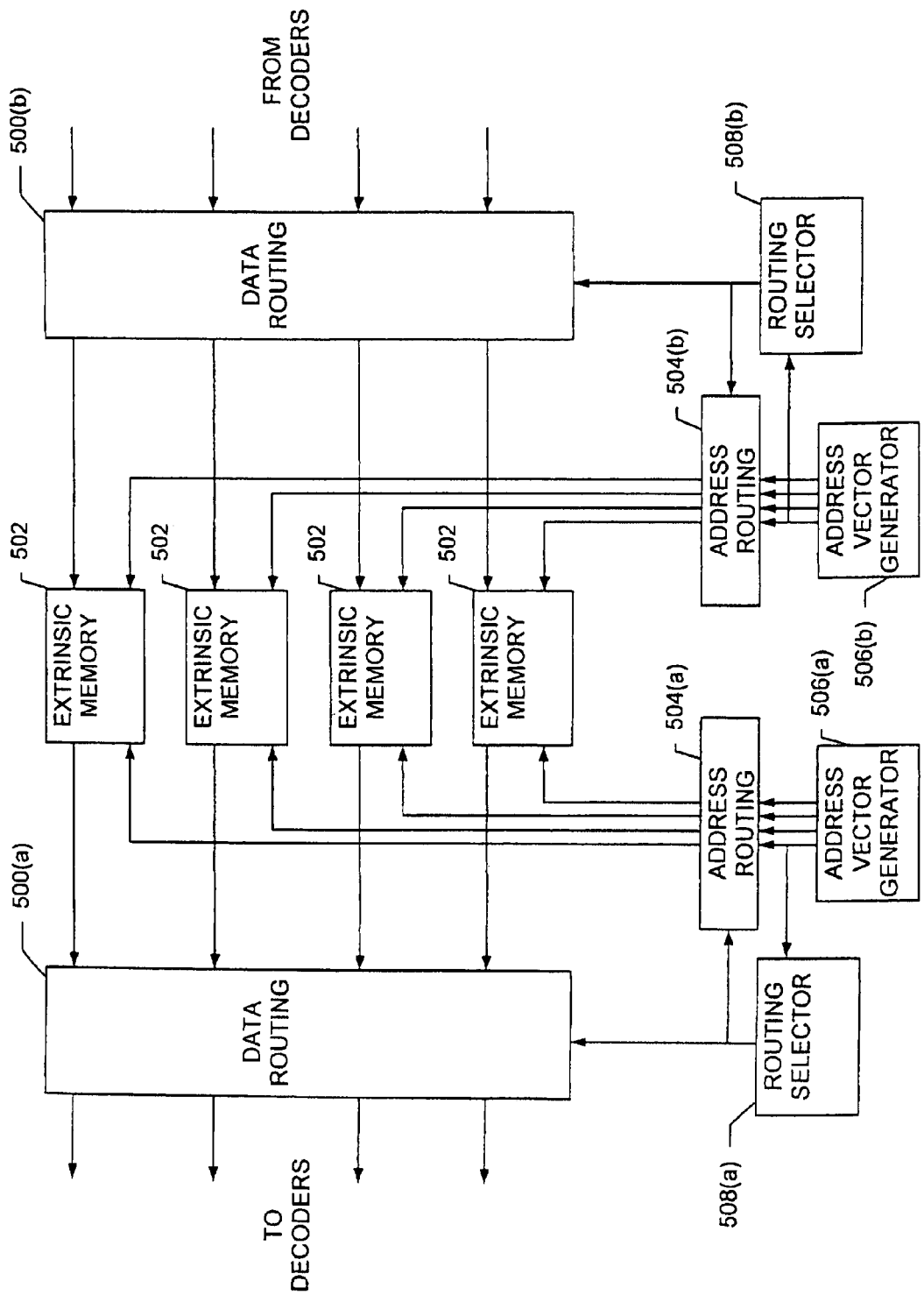
FIG. 5 is a block diagram of a portion of a turbo decoder configured in accordance with one embodiment of the present invention.

FIG. 5 is a block diagram of a portion of a turbo decoder configured in accordance with one embodiment of the present invention. As well known in turbo decoding, the extrinsic information is generated by the decoder during a first subiteration, and then that extrinsic information is reused in interleaved order by the decoder during a second subiteration.

During operation, an interleaved subiteration begins by the generation of a vector of addresses by address vector generator 506(*a*). Address vector generator generates M address, where M is the number of decoding units, and which in the exemplary embodiment is 4. The four addresses correspond to the i$^{th}$ address in each of the four subsections of the interleaver.

The address vector is received by address routing circuit 504(*a*). Additionally, one of the addresses is routed to routing selector circuit 508(*a*). Routing selector circuit 508(*a*) determines the particular index associated with the received address, and forwards that address to address routing circuit 504(*a*) and data routing circuit 500(*a*).

In the described embodiment, the index of the other subsections can be determined based on the index of any one subsection. In particular, if the index for the first one subsection is j, then the indexes for the next three subsections are (j+1)% M, (j+2)% M, and (j+3)% M. Thus, only one routing selector circuit 508(*a*) is necessary for each set of routing circuits. In other embodiments of the invention this property may not be present (for example when memory interleavers are being used), and one routing circuit for each address in the address vector will be necessary.

Address routing circuit 504(*a*) receives the address vector and the routing index, and reroutes the addresses into a new address vector based on the index. Thus, if the index is 2, the first address is routed to the second memory, and the remain addresses are rerouting based on the other index calculation described above. The addresses are received by the extrinsic memories 502, which output the corresponding data to data routing circuit 500(*a*).

Data routing circuit 500(*a*) receives the data and routes it to the decoder for which the corresponding address was generated based on the index from routing selector 508(*a*). The resulting data vector or extrinsic information is received by the decoders (not shown) which perform decoding using the extrinsic information as well as the receive samples (not shown).

After some processing delay, the decoders generate new extrinsic information that is received by data routing circuit 500(*b*). As the new extrinsic information is received, address vector generator 506(*b*) generates the address vector for the interleaver, and the address vector is received by address routing circuit 504(*b*) and routing selector 508(*b*) receives one of the addresses.

Routing selector 508(*b*) determines the index for one address, and that index is supplied to address routing circuit 504(*b*) and data routing circuit 500(*b*). Data routing circuit 500(*b*) routes the interleaved extrinsic information generated during the decoding to the proper extrinsic memory 502, and address routing circuit 504(*b*) routes the interleaver address vector to those extrinsic memories 502 as well. The data is then written in non-interleaved order for processing during the next subiteration.

Figure 6A:
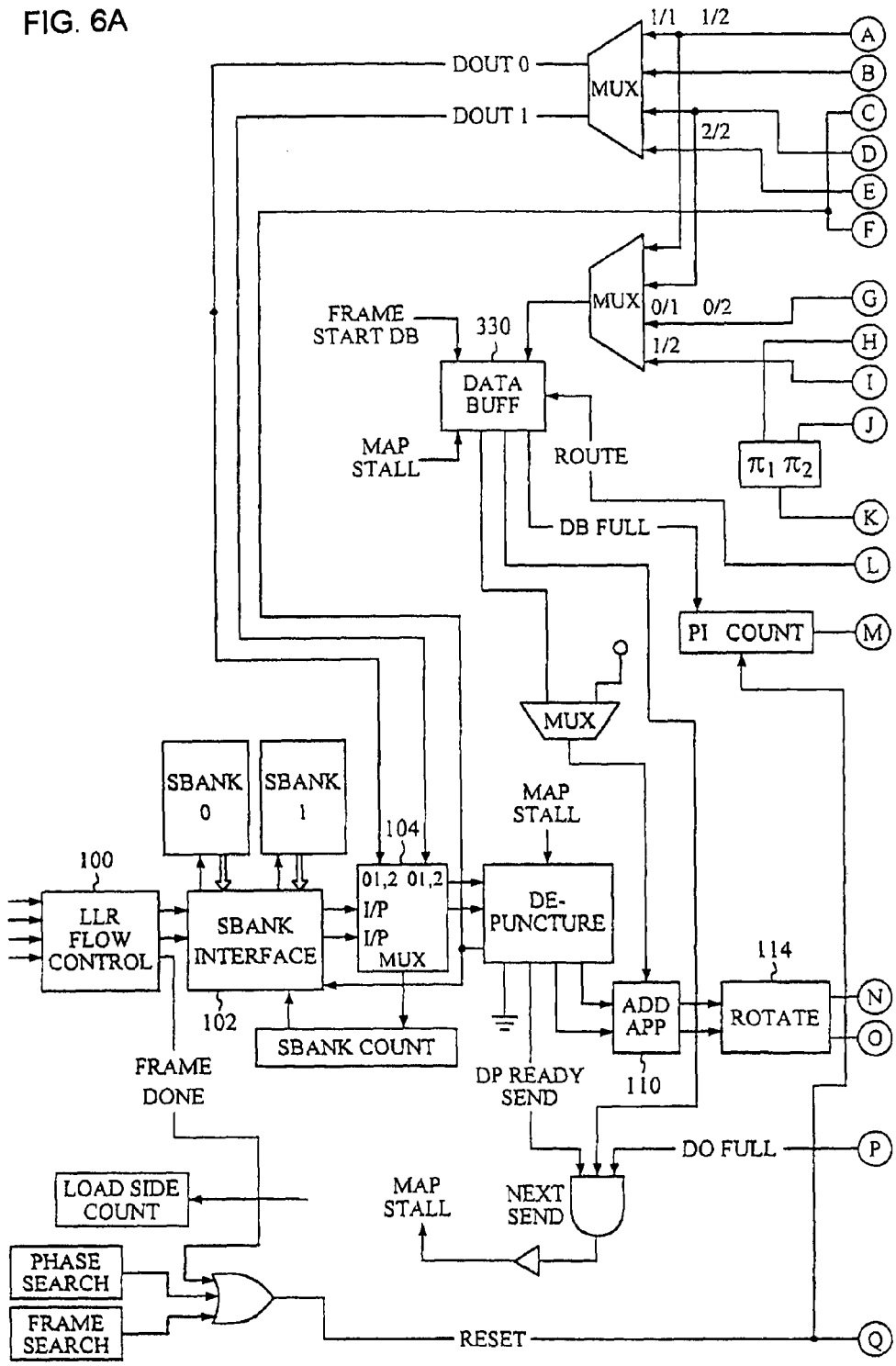
FIGS. 6A and 6B show an iterative decoder configured in accordance with an alternative embodiment of the invention in which a non-indexed interleaver is used.
Figure 6B:
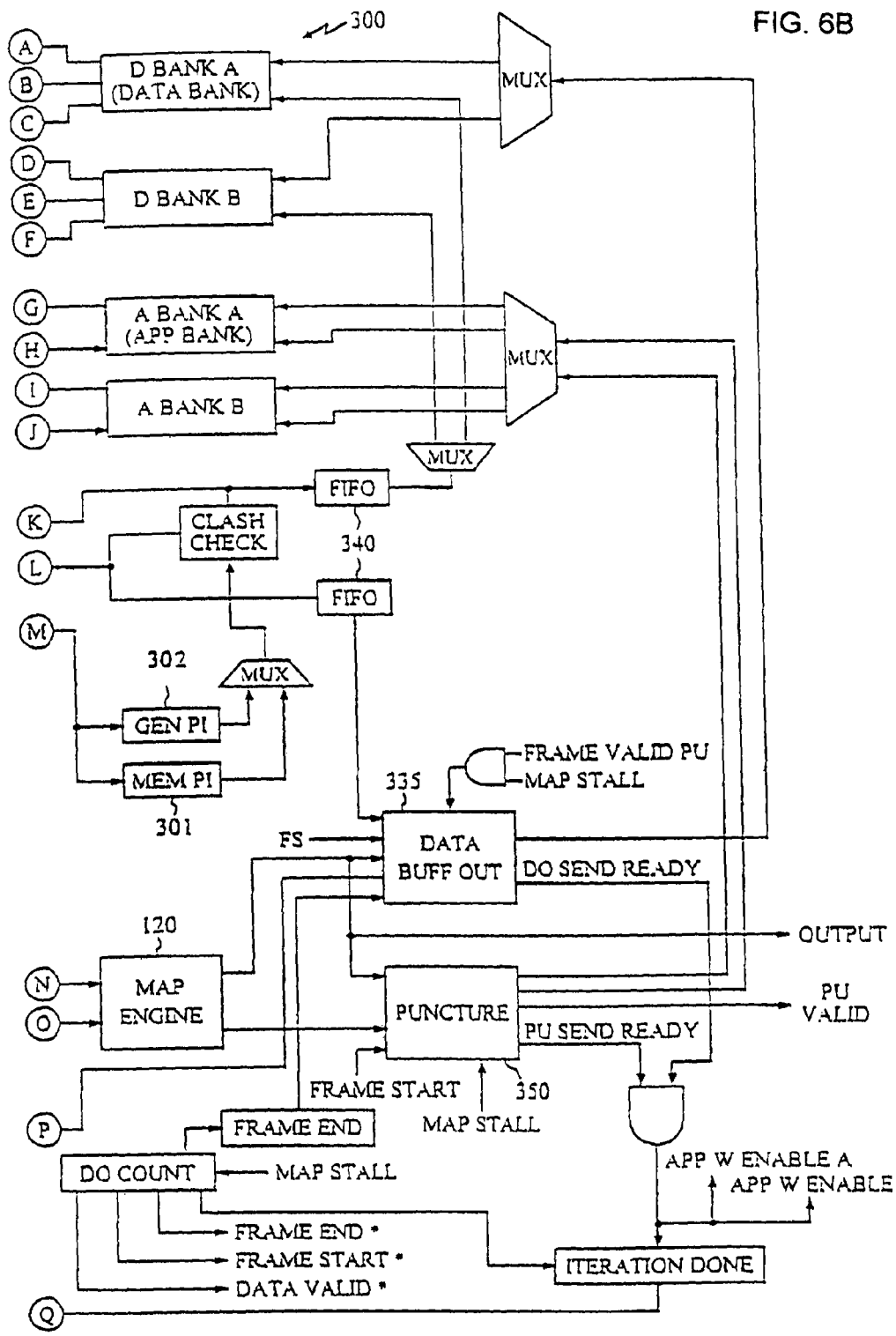

FIGS. 6A and 6B show an iterative decoder configured in accordance with an alternative embodiment of the invention in which a non-indexed interleaver is used. In some instances, a non-index interleaver may be required to meet preexisting specifications or for performance reasons.

Referring now to FIGS. 6A and 6B, receive samples are received by LLR flow control 100. LLR flow control receives samples in sets of between 1 and 4. These set correspond to different modulation scheme such as BPSK (1 sample per set) QPSK (2 samples per set), 8PSK (3 sample per set) and 16QAM (4 samples per set). LLR flow control writes out samples in pairs to sample bank (sbank) interface 102.

Sbank interface simultaneously writes in sample pairs to one of the sample memory banks (sbank0 and sbank1) while reading out sixteen sets of sample pairs from the other sample memory bank.

Multiplexer 104 receives the sixteen sets of sample pairs from sbank interface 102 and also receives sixteen set of soft decision data from APP memory 300. During a first mode, multiplexer 104 supplies the sample bank data to depuncture circuit 108 and during a second mode multiplexer 102 supplies the soft decision data to depuncture circuit 108. The first mode is preferably parallel concatenated convolutional (PCCC) mode as well as the outer code for serial concatenated convolutional (SCCC) mode and the second mode is for inner codes of serial concatenated convolutional mode.

Depuncture circuit 108 inserts puncture values according to a puncture pattern and add app 110 receives the depunctured values from depuncture circuit 108 as well as extrinsic information from extrinsic memories 300. During the first iteration of SCCC decoding the extrinsic information is not supplied during the inner code processing. Also, the outer most code of SCCC processing does not use extrinsic information. PCCC decoding and the inner code of SCCC decoding for iterations greater than one use extrinsic information. Additionally, middle codes of 3 code SCCC will also use extrinsic information for iterations greater than one.

In an exemplary embodiment, the samples stored in the sbank memories and the extrinsic memories are divided into 16 subsections. The subsection are preferably divided in the order received, so that each subsection is approximately one sixteenth of the frame being decoded, and the second subsection follows the first and the third follows the second, etc.

Each subsection of the sample bank memory is decoded by a MAP decoder within MAP engine 120. A MAP decoder is a decoder that performs the maximum a posteriori decoding algorithm. During a warm up period, the last portion of the previous subsection is read into the particular decoder performing the decoding for that section. This is accomplished by reading out the end of each subsection from each sbank subbank and from each extrinsic subbank, and then rotating, or shifting, the output of this read using rotate circuit 114. Typically the warm up period takes 32 decoding cycles.

Once the warm up period has been competed each subsection of data is applied to a particular MAP decoder within MAP engine 120. MAP engine preferably performs decoding using a sliding window algorithm to reduce the amount of state memory necessary to perform the decoding. Additionally, MAP engine preferably contains local cache memories to store the values being decoded so that multiple passes can be made over the values in accordance with the MAP decoding algorithm.

To read out extrinsic information from extrinsic memory 300 (also called APP memory because it contains a posteriori information), a special deinterleaver circuit is used.

The interleaver addresses are generated by either a memory based interleaver (mem_pi) 301 or a generator function (gen_pi). The interleaver circuits output 16 memory addresses, which correspond to the 16 MAP queues that will be performing the decoding. The interleaver addresses are received by clash check circuit 310, which determines the extrinsic memory bank in which data associated with that address is stored.

In accordance with the indexed interleaver circuit described above, the use of clash check would be eliminated and overall efficiency increased.

When multiple requests are received for the same memory bank, clash check select one request and queues up the other requests. During subsequent clock cycles multiple requests for the same memory bank are arbitrated based on the queue size from which the request originates.

Clash check generates addresses which are forwarded to the extrinsic memory, and also generates an enable vector and a routing vector, both of which are forward to data-buff-in circuit 330. The enable vector tells data buff in which pipeline were selected, or "won", in the arbitration process, and therefore should be read into the data buffer. The routing vector tells which extrinsic memory bank will be supplying the data to that MAP queue.

Data buff in assembles the data from extrinsic memory 300 into complete rows of sixteen, and forward the complete row to add app circuit 110 where they are added with the sample data or other decode data.

MAP engine 120 simultaneously decodes the sixteen subsections of the frame and outputs extrinsic as well as soft decision data. Extrinsic information is received by data buff out, which also receives the routing vectors and valid vectors from clash check after being delayed by FIFO's 340. Data buff out 335 deinterleaves the extrinsic data by routing to extrinsic memory 300 according to the routing and enable vectors, and by also routing the enable signals themselves according to the routing vector. Extrinsic memory 300 receives the address vector after also being delayed by a FIFO, and writes the values from data buff out based on those addresses as well as enable signals forwarded form data buff out. Data buff out is used during PCCC decoding as well as during the SCCC codes for codes other than the outer most code.

Puncture circuit 350 receives soft decision values from MAP engine 120 including systematic and parity soft decision values. Puncture circuit 350 punctures out values according to a puncture pattern, and supplies the punctured data to extrinsic memory 300. The punctured values are preferable written in the order that they are generated, and thus no deinterleaving is necessary.

Puncture circuit 350 is used for the outer codes in SCCC decoding and the values generated are used as the extrinsic information during the decoding of the more inner code.

In the exemplary embodiment shown, the extrinsic memory is comprised of four banks. These four banks are used for performing 3 constituent code SCCC decoding. In particular, for the middle code, one bank supplies soft decision data, another bank receives soft decision data, a third bank supplies extrinsic information, and the fourth bank receives extrinsic information.

Figure 7:
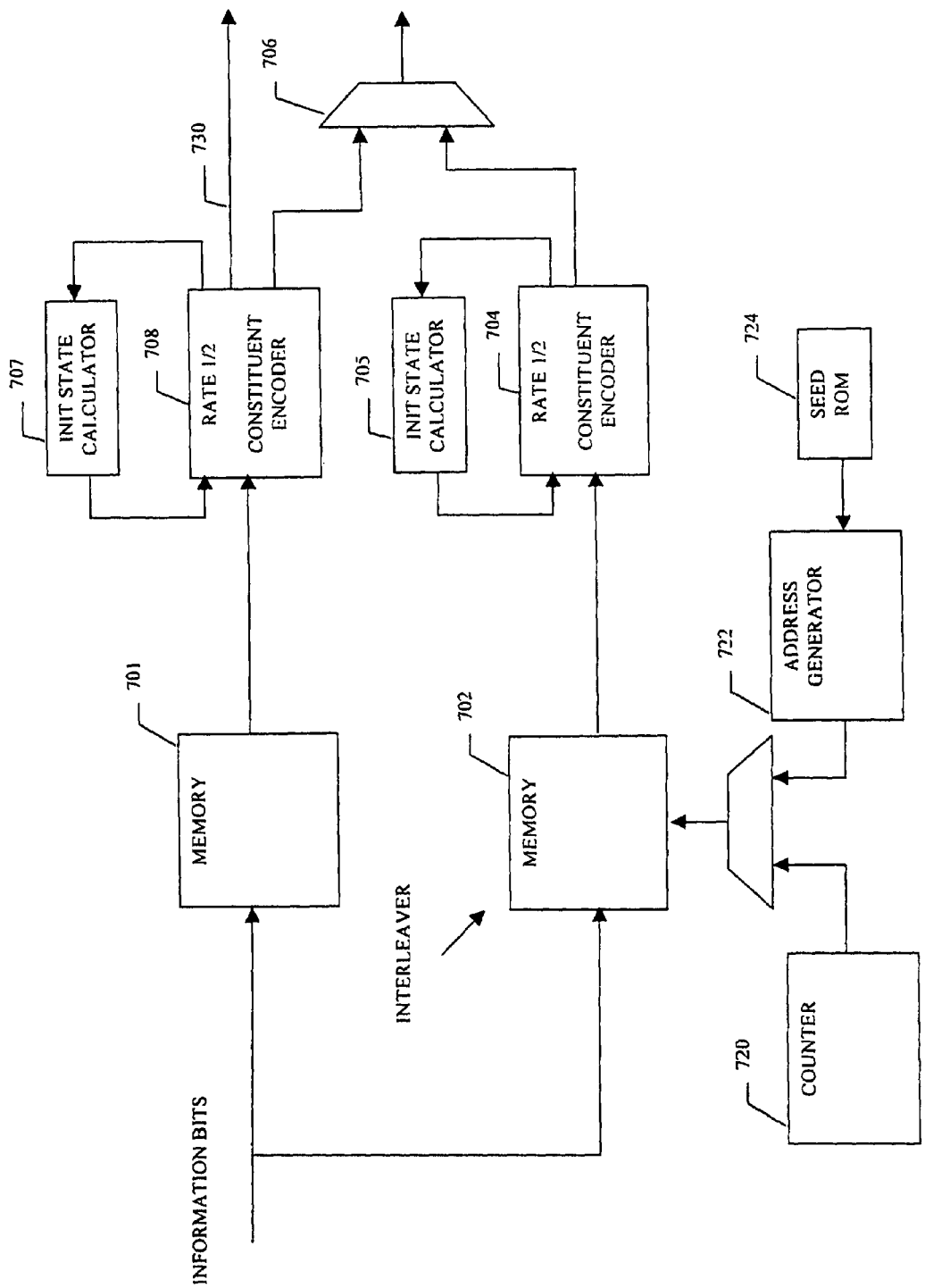
FIG. 7 is a block diagram of a turbo encoder and decoder configured in accordance with one embodiment of the invention.
Figure 8:
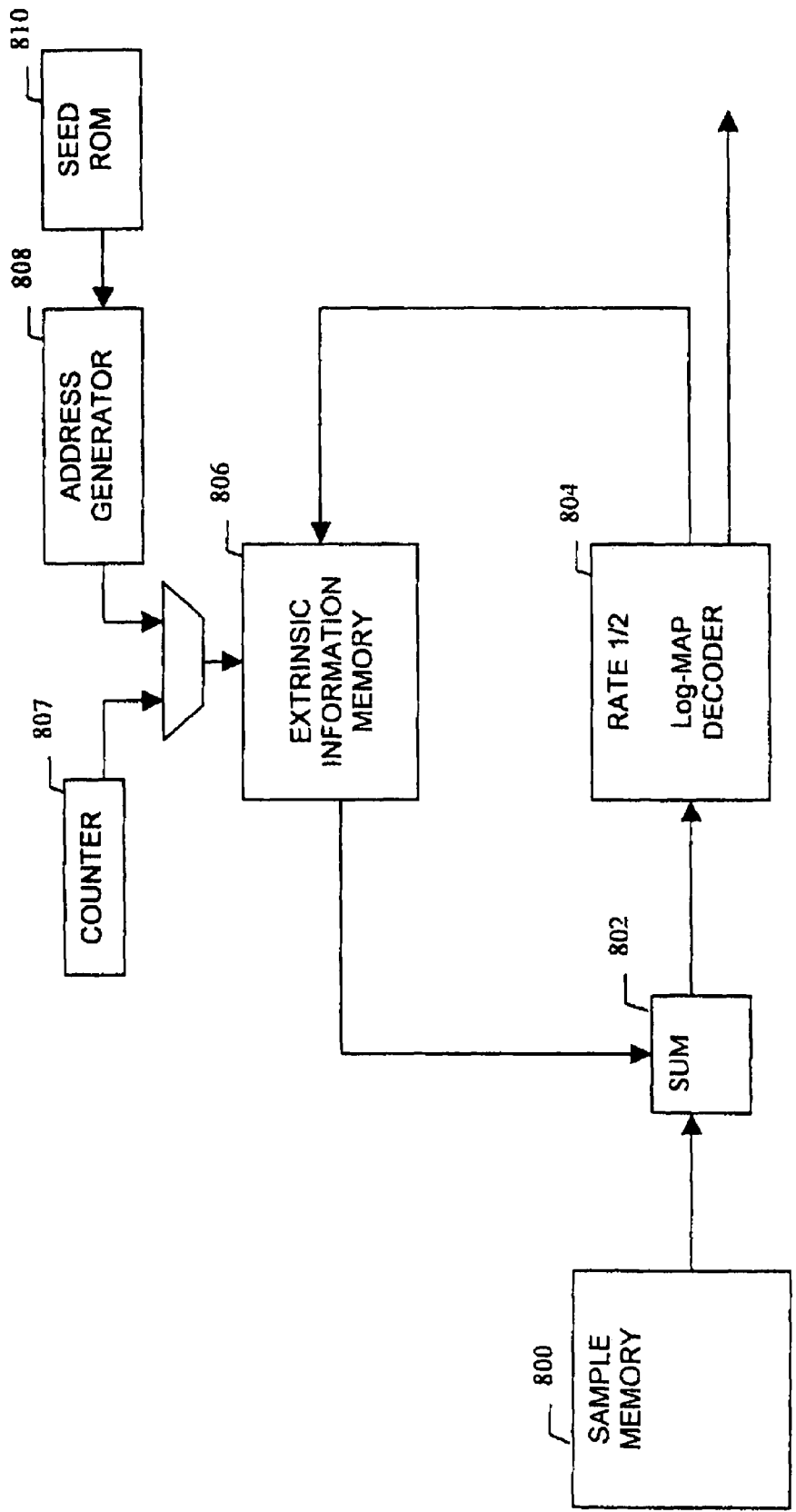
FIG. 8 is a block diagram of a turbo decoder configured in accordance with one embodiment of the invention.
Figure 9:
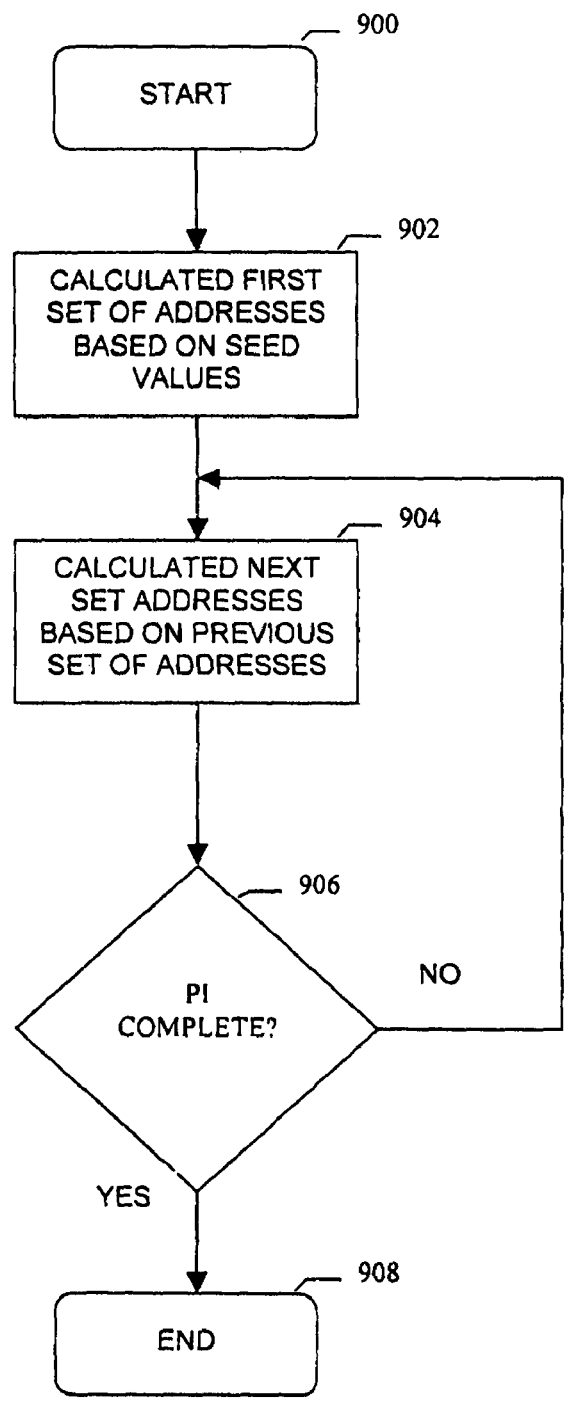
FIG. 9 is a flow chart illustrating the generation of the interleaver addresses in accordance with one embodiment of the invention.

A method apparatus for generating an interleaver, along with a system for performing. communication using that interleaver, is now described in detail with respect to the exemplary embodiments of FIGS. 7-9. In accordance with one embodiment of the invention, a pseudo random interleaver is generated by dividing the desired address space N into n subsets of m values (n*m). One value from each subset is selected as a seed, creating a set of n seeds used to generate the rest of the interleaver.

In a first exemplary embodiment, m is equal to 2n. An exemplary interleaver of size 15488 (N) is generated, corresponding to a value n of 88 and a value m of 176. In accordance with the exemplary embodiment, the set of 15488 addresses is divided into n subsets, where the subsets are defined by the result of dividing the interleaver address values by the modulo-n of the address. Additionally, the address are also categorized by an "n-multiple", which is the number of times n can be divided into the address. In the exemplary case of n=88, there are 88 possible modulo-n values and 176 possible n-multiple values in the address space of 15488. For example, the value 1000 has a modulo-n of 32 (1000% 88), and its n-multiple is 11 (1000/88). The value 12523 has a modulo-n of 27 and an n-multiple of 143.

While there are many other techniques for dividing the address space into subsets (some of which are described below), the use of the modulo-n index provides many advantages. In particular, the used of the modulo-n index causes all the values within the subset to be equally spaced, thus ensuring a minimum distance of n between any to point in the subsets regardless of the order of the values within the subset. Using the modulo-n values of the addresses to define the subsets also allows the entire subset to be generated by just specifying the modulo-n value of the subset, or by just supplying one value from the subset. Additionally, the minimum distance is the same for each subset (with the minimum distance being equal to n), further simplifying generation of the entire interleaver as described in greater detail below.

Additionally, if one (seed) value from any subset is provided, the rest of that subset may be generated by adding n to the seed value and taking the result modulo-N. For example, if the seed value is 500, then the series 500, 588, 676 . . . 412 represents one modulo-n subset. Other methods for defining subsets, and therefore for generating all the addresses in the subset, are consistent with the use of the present invention including, for example, forming a series by adding p*n to the seed value (modulo-N), where p is relatively prime to n.

Thus, in the current embodiment of the invention the entire address space for the n*m interleaver (where n=88 and m=176) is divided into 88 subsets defined by the modulo-88 value of each address. Once the subsets are defined, one value is selected from each subset and placed in a particular order to form the seeds for the interleaver.

In accordance with a first embodiment of the invention, the seeds are selected so that no two seeds have the same or adjacent n-multiple values. In the case where m=2n, the n-multiple values of the seeds must be either all even, or all odd, in order to satisfy this condition.

Finally, the selected seeds are placed in a particular order. In accordance with a first embodiment of the invention, the seeds are ordered so that the n-modulo value is within d of the location of the seed within the set, with at least one seed placed out of order with respect to its modulo-n value. For example, given a value d of 10, the seed with the n-modulo index of 0 must be in located among the first 10 seeds in the set. A seed with a modulo-n index of 18 could be located at any location between 0 and 36. This seed configuration is used when the entire interleaver is generated by repeatedly adding n to the seed set and taking the result modulo-N (N−15488).

In an alternative embodiment of the invention, the seeds are placed in reverse order with respect to their modulo-n value, offset by a dither amount less than or equal to n. Thus, for a d of 10, a seed with a modulo-n value of 87 can be placed in anyone of the first 10 locations. Once the seeds are configured, the rest of the interleaver is generated by repeatedly modulo-N subtracting n from each seed until 15488 values have been generated.

For either embodiment, for a given value d, the location of the seeds should preferably minimize the duplication of offset values. That is, the amount of dithering should be spread across the dither value d as much as possible. For example, with a d of 10, there are 11 possible offset values 0-10. With 88 seeds, maximum dithering will move 8 seeds by 0, 8 seeds by 1, 8 seeds by 2 and so on, with the final 8 seeds offset by 10. Typically, a random dithering will come naturally come close to this result, and is sufficient for good performance based on the selection of d.

Moving the seeds from their natural modulo-n based order increases the overall randomness of the interleaver substantially with only a relatively small reduction in spreading. Increased randomness improved the performance of a turbo code employing the interleaver, particularly for frames greater than 4000 bits, but some improvement is also seen for frames as large as 1000 bits.

In general, the only restriction on d is that it be greater then 1, although some ranges tend to give better performance than others. For example, d is typically selected to be between 10-70% of n. For smaller interleavers it is often useful to keep d smaller to preserve more of the spreading property of the interleaver. Typically, d should be set so that a target spread of at least 25 is maintained.

For larger frames higher values of d are preferable, as more randomness is desirable. Typically, d-will be 50% of n for interleavers having greater than 10,000 addresses. This amount of dither preserves spreading while also increase randomness and therefore the rate of convergence when incorporated into a turbo code.

In a preferred embodiment of the invention, the seeds form the first n addresses in the interleaver. The rest of the interleaver is generated by adding n (modulo-N) to the previous n addresses. In the exemplary case, this results in 175 additional sets of 88 address for a total of 15488 addresses. Alternatively, the rest of the interleaver can be generated by subtracting n (modulo-N, wrapping around for values <0) from the previous n addresses.

In other embodiments of the invention, integer multiples of n can be added to the seeds, or a number q can be added where q is relatively prime to n or equal to one. However, the spreading for these other embodiments can be reduced too substantially for many incrementing values and therefore searching is typically required to confirm suitable spreading can achieved for some interleaver sizes and increment combinations.

While many interleaver sizes will work in different embodiments of the invention, 15488 is an excellent frame length for a variety of reasons. In particular, it is evenly divisible by many powers of 2, including 2, 4, 8 and 16, facilitating the division of the frame into separate parts for parallel decoding. A system and method for performing such decoding is described in co-pending U.S. patent application Ser. No. 60/174,290 incorporated herein by reference, and the co-pending application claiming priority thereto 09/742,248 entitled System and Method for Efficient Processing of Turbo Codes.

Additionally, 15488 is not a multiple of 3, 7 or 15. The numbers 3, 7 and 15 are typical periods for various constituent encoders, including 4, 8 and 16 state encoders. In order to perform tail biting the length of the frame cannot be an even multiple of these numbers, and therefore this frame length provides the flexibility to be used with the most commonly used constituent encoders.

A more detailed description of interleaver generation process performed in accordance with one embodiment of the invention is described for a much smaller interleaver.

Table. I shows the beginning of the seed generation process for an interleaver of size n*m, where n=8 and m=16, for a total interleaver size N=128. In Table I a set of seeds (left-most column) are generated based on a set of modulo-n values (column 2) and n-multiple values (column 3). The seed values are equal to the modulo-n value+n*n-multiple value (seed=modulo-n+[n*n-multiple]) which is listed in the right-most column.

As described above, the n-multiple values are selected so that no two values are the same or offset by one. In this case all the n-multiple values are all even, but using all odd n-multiple values would also satisfy this condition. As listed in Table I, the modulo-n values are placed in order of their location, and the n-multiple values are also listed from smallest to greatest.

TABLE I

| Location | Modulo-n | n-multiple | seeds |
|---|---|---|---|
| 0 | 0 | 0 | 0 |
| 1 | 1 | 2 | 17 |
| 2 | 2 | 4 | 34 |
| 3 | 3 | 6 | 51 |
| 4 | 4 | 8 | 68 |
| 5 | 5 | 10 | 85 |
| 6 | 6 | 12 | 102 |
| 7 | 7 | 14 | 119 |

In accordance with one embodiment of the invention, the n-multiples are first shuffled in random order, yielding the results of Table II.

TABLE II

| Location | Modulo-n | n-multiple | Seeds |
|---|---|---|---|
| 0 | 0 | 6 | 48 |
| 1 | 1 | 12 | 97 |
| 2 | 2 | 4 | 34 |
| 3 | 3 | 10 | 83 |
| 4 | 4 | 14 | 116 |
| 5 | 5 | 2 | 21 |
| 6 | 6 | 0 | 6 |
| 7 | 7 | 8 | 71 |

Addtionally, the modulo-n values are shuffled with the restriction that no value be moved more than an amount d relative to its location within the set of seeds. Table III illustrates an exemplary shuffling of the modulo-n values with a value d=2. As illustrated in Table III, each modulo-n value is shifted by either 0, 1 or 2 relative to its location within the sets of 8 seeds. For example, modulo-n value 4 is placed at location 3, just 1 away from location 4, and the modulo-n value of 2 is placed at location 0, just 2 away from location 2. As noted above, the modulo-n values may also be listed in decreasing order from 7 to 0, and may also have a wrap around configuration starting at some middle value and incrementing or decrementing.

TABLE III

| Location | Modulo-n | n-multiple | Seeds |
|---|---|---|---|
| 0 | 2 | 6 | 50 |
| 1 | 1 | 12 | 97 |
| 2 | 0 | 4 | 32 |
| 3 | 4 | 10 | 84 |
| 4 | 3 | 14 | 115 |
| 5 | 7 | 2 | 23 |
| 6 | 5 | 0 | 5 |
| 7 | 6 | 8 | 70 |

The resulting seeds shown in Table III can be used to generate the interleaver of size N=128 by using the seeds as the first 8 values of the interleaver. The next set of 8 addresses are generated by modulo-128 adding n (n=8) to the set of 8 seeds. The next set of 8 address are generated by modulo-128 adding 8 to the previous set of 8 addresses. This is repeated until 128 addresses are generated. In an ASIC, the interleaver can be generated by simply storing the n seed values.

The resulting interleaver will have a spread slightly less than 16 (which is equal to m). As d is increased the 16 will typically decrease but randomness will increase. The N=128 interleaver described above is provided for purposes of illustration, as turbo codes employing interleavers of size 128 will typically not benefit significantly from a d greater than 1. The performance improvement in a turbo code from a d greater than 1 will increase as the size of the interleaver increases.

The above described embodiment of the invention works best when m is twice m (m=2*n), and typically interleavers of this size provide the best spreading properties. However, for many applications, frames sizes than can not be formed by an combination of n*m where n and m are integers and m is 2*n. Additionally, some applications benefit from interleavers with more randomness than can be provided from the maximum dithering available in the above-described embodiment of the invention.

In an alternative embodiment of the invention, and interleaver of size n*m can be constructed for any m greater than or equal to n. In this embodiment of the invention, the set of seeds are constructed in similar fashion to the first interleaver, except the n-multiple values of the seeds can be adjacent rather then separated by a value of 1. Thus, the set of n-multiple values used to construct the interleaver will not be all odd or all even numbers.

The remaining seed and interleaver generation process is substantially the same as the previously described interleaver, including the dithering process. In this embodiment, the higher number of seed values—relative to the entire interleaver—typically provides greater randomness than a similarly sized interleaver with fewer seed values. Additionally, the greater variance in the distance between the seed values also adds increased randomness. This inherent increase in randomness typically reduces the amount of additional dithering necessary. For example, a dither value of d between 1 and 40% of n typically provides sufficient randomness in this embodiment of the invention, with dithering of as little as 10% very good performance increases for frames larger than 1000 addresses.

In still another embodiment of the invention, interleavers of size n*m can be generated for any integer value of n and m. In this embodiment of the invention, the generation of the seeds proceeds somewhat differently than the previous two embodiments of the invention.

In accordance with this embodiment of the invention, the set of n seeds are generated based on a seed_step factor, where seed_step an integer number relatively prime to n. To determine the best value of seed_step some searching may be required. For m less than n, a seed_step that is the closest relatively prime integer m is typically suitable. For example, for an n of 8 and an m of 4, a suitable seed_step value would be 5.

Once the seed_step value has been selected a set of n seed_step multipliers are generated in random order by generating a set of integers between 0 and (n−1). These integers are then multiplied by seed step to generate the set of n seeds. Table IV illustrates the generation of 8 seeds that can be used in an 8 by 4 interleaver using a seed_step of 5.

TABLE IV

| Location | seed_step | Seed_step multiplier | Seed |
|---|---|---|---|
| 0 | 5 | 4 | 20 |
| 1 | 5 | 1 | 5 |
| 2 | 5 | 6 | 30 |
| 3 | 5 | 5 | 25 |
| 4 | 5 | 3 | 15 |
| 5 | 5 | 7 | 35 |
| 6 | 5 | 2 | 10 |
| 7 | 5 | 0 | 0 |

In a preferred embodiment of the invention, the seeds are used as the first set of n addresses. The next set of addresses are generated by adding a value set_step to the seeds, and then the remaining sets of address (in this case two more sets) are generated by adding (modulo-N) set_step to the previous set of addresses. Set_step is preferably selected so that it is relatively prime to both n and m. Additionally, when m is less than n, set_step is preferably chosen so that it is also close to n/2 while remaining relatively prime to n and m. In some cases searching is required for set step, but typically a value between 1 and 2n will yield a spreading amount of at least m/2.

This interleaver typically produces more randomization and less spreading relative to the two other methods described above, and typically no additional dithering is required.

In still another embodiment of the invention, an n*m interleaver is generated by dividing the total interleaver address space into n spaces comprised of the first m addresses, then next m addresses, up to the nth set of m addresses. One value from each of these sets is selected for the seed set and ordered so that the resulting seed set has a minimum spreading distance of s where s is preferably greater than m/2. This seed set is used as the first set of n addresses in the interleaver.

In one embodiment of the invention, the next set of addresses is generated by adding a factor f to each seed, where f is i*set_step modulo-m ([i*set_step] % m), where set_step is relative prime to m. The value i is the index of the set of addresses being generated.

Table V illustrates the generation of a 32 address 8*4 interleaver. Addresses 0-7 are the seed values, and set step is equal to 3.

TABLE V

| Addresses | 0 | 1 | 2 | 3 | 4 | 5 | 6 | 7 | i | f |
|---|---|---|---|---|---|---|---|---|---|---|
| 0-7   | 0 | 24 | 16 | 4 | 28 | 8  | 12 | 20 | 0 |   |
| 8-15  | 3 | 27 | 19 | 7 | 31 | 11 | 15 | 23 | 1 | 3 |
| 16-23 | 2 | 26 | 18 | 6 | 30 | 10 | 14 | 22 | 2 | 2 |
| 24-31 | 1 | 25 | 17 | 5 | 29 | 9  | 13 | 21 | 3 | 1 |

Other embodiments of the invention comprise dividing the address space into n subsets, where the subsets maybe generated on the fly using a mathematical operation or small look-up table. One address from each subset is then selected and ordered so that the spread of the resulting cross set is above a threshold that is typically greater than 20 or $(N/2)^2$ (where N is the size of the interleaver) whichever is less, and so that the resulting set of address has significant randomness.

These addresses are then used as the first set of addresses in the interleaver. The remaining addresses are generated so that the spreading distance in the first set is substantially preserved resulting in a highly spread random interleaver that can be used in a turbo code.

As should be apparent, the various embodiments of the invention describe n*m interleavers generated using n seeds, where the seeds form the first n addresses in the interleaver. Those skilled in the art will recognize that alternative embodiments of the invention may use m seeds, where each seed defines a set of n addresses. In this embodiment, the first seed defines the first n addresses, which are generated based on that seed (the seed itself can be used as an address, but does not have to be).

The first set of addresses are typically generated using a pseudo random function such as a congruential series using relative prime increments, selected to provide sufficient spreading between the addresses. Another method that ensures proper spacing is to use the pseudo random function generator to generate the n-multiple values, and then multiply those values by n to determine the addresses.

Once the first set of addresses are generated using the first seed, the next set of addresses are generated using the next seed, typically using the same pseudo random function, but not necessarily. The seeds are typically chosen so that spreading distance is maintained across multiple sets of addresses. If the same pseudo random function is used, this typically only requires the difference between any two adjacent seeds (preferably including wrap around from the last to the first seed) be greater than the minimum spreading distance within any set of addresses in order to preserve the overall spreading distance. Preserving the spreading distance can also be achieved by limiting the spacing of the seeds to some multiple of n.

In a more general embodiment of the invention, the entire set of interleaver addresses (the interleaver address space) is divided into n subsets of addresses. The n subsets are preferably substantially equally spaced. For example, the subsets may be defined different modulo-n indexes as done in at least of the embodiments described above. Alternatively, the subsets may be defined as portions of relative prime sequences, each sequence using a different starting index, as done at least one other embodiment of the invention described above.

Many other methods for generated substantially equal spaced subsets of addresses can be employed in alternative embodiments of the invention. However, the various embodiments provided herein allow for a range of spreading, randomness, flexibility and randomness tradeoffs.

Typically, making the subsets substantially equally spaced means the addresses are substantially equally spaced with respect to the other addresses within the subset. For example, the address may all be multiples of some number, or may be some consecutive portion of the total address space. Alternatively, the addresses may only be evenly spaced with respect to the addresses in the other subsets. Thus, while the addresses within a particular subset have varied separation from one another, the variation of address separation within the other subsets is substantially similar.

Once the interleaver address space has been divided into a set of substantially equally spaced subsets, a set of seed values are then selected. The seed values are selected so that the set of seeds has a minimum spreading value, and so that the spreading value is substantially maintained when the remaining sets are generated based on the seed values.

Once again, various methods for achieving this result have been described above. In general, a set of seeds are selected based on a randomly chosen set of multiples of the row size m. The spacing of the seeds is then selected so that the subsequent sets will remain well spread with respect to the previous set.

FIG. 7 is a block diagram of a turbo encoder and decoder configured in accordance with one embodiment of the invention. Information bits to be transmitted and encoded are received by constituent encoder 708 and memory 702. In the described embodiment of the invention, the information bits are written into memory 702 while being addressed by counter 720. Once a frame of data has been written in the information bits are read out from memory 702 while being addressed by address generator 722.

In the described embodiment, address generator 722 generates a series of interleaved addresses in accordance with the above described invention, typically using the seeds stored in seed ROM 724. Thus, the information bits are read out of memory, and therefore received by constituent encoder 704, in interleaved order.

In a first described embodiment of the invention, constituent encoder 708 receives the information bits in non-interleaved order and performs convolutional encoding on those information bits. When using interleavers generating in accordance with the above described invention, convolutional encoder 708 is preferably a rate 1/2 systematic recursive convolution code. Rate 1/2 codes benefit from the increased spreading characteristic of the present invention, and are relatively simple to implement when compared to encoders with higher natural rates. However, other natural rate encoders may be employed with the interleavers constructed in accordance with the invention.

In this first embodiment of the invention, constituent encoder 708 performs a first encoding of the non-interleaved information bits. Once the entire frame of data has been encoded, the state information with constituent encoder 708 is received by initialization state calculator (init state calculator) 707. Init state calculator 707 receives the initialization state and calculates a starting initialization state.

Once the starting state has been set, the frame is then encoded a second time. During this second encoding, the state of constituent encoder 708 is initialized using the initialization state calculated by init state calculator 707. The information bits are then encoded from memory 701 a second time, and the resulting code symbols are received by multiplexer 706. The systematic bits 730 are also forwarded for transmission.

Similarly, constituent encoder 704 performs two encodings on interleaved information bits received from memory 702. After the first encoding, the final state of constituent encoder 704 is received by init state calculator 705. Init state calculator 705 calculates an initialization state based on the final state received. The state of constituent encoder 704 is then initialized to the initialization state calculated by init state calculator 705. Once initialized, constituent encoder 704 performs the second encoding on the interleaved information bits from memory 102, and the resulting code symbols are received by multiplexer 706.

Multiplexer 706 orders and punctures code symbols from the two encoders in order to generate the desired level of coding. The resulting code symbols and systematic bits 730 are then forwarded for transmission.

By using a code comprised of a highly spread generatable interleaver in combination with a 16 state code and a described interleaver.

The use of either init state calculators 703 or 707, or both, may be omitted in alternative embodiments of the invention. However, this will typically reduce overall performance of the code because the two codes are not terminated. Alternatively, one of the two codes (typically the first) may be terminated by adding flush bits to the end of the information bits. However, the additional bits reduce throughput relative to the use of init state calculators 703 and 707. A description of tail biting can be found in the paper Weiβ, Ch.; Bettstetter, Ch.; Riedel, S.: Turbo Decoding with Tail-Biting Trellises. In: Proc. 1998 URSI International Symposium on Signals, Systems, and Electronics, 29. Sep.-2. Oct. 1998, Pisa, Italien, pp. 343-348.

To perform tail biting for encoders with feedback (which include the recursive systematic convolution codes described herein), the ending state $x_N$ depends on the entire information vector u encoded. Thus, for a given input frame, the initial state $x_0$ must be calculated, where $x_0$ will lead to the same state after N cycles.

This is solved by using the state space representation:

$$xt+1 = A_t x_t + B U_{T,t} \tag{1}$$

$$vT,t = C_t x_t + D u_{T,t} \tag{2}$$

of the encoder. The complete solution of (1) is calculated by the superposition of the zero-input solution x[zi],t and the zero-state solution x[zs],t:

$$xt = x_{[zi],t} + x_{t,[zs]} = A_t x_0 + \mathrm{sum}_{(j=0->t-1)} A^{(t-1)-j} B u_{T,t} \tag{3}$$

By setting the state at time t=N equal to the initial state $x_0$, we obtain from (3) the equation $$(A^N + I_m) x_0 = x_{[zs],N} \tag{4}$$

where $I_m$ denotes the (m×m) identity matrix. If the matrix $(Z_n\_I_m)$ is invertible, the correct initial state $x_0$ can be calculated knowing the zero state response $x_{[zs],N}$ Based on this logic, the encoding process should be done in two steps:

The first step is to determine the zero-state response $x_{[zs],N}$ for a given information vector u. The encoder starts in the all-zero state $x_0=0$; all N $k_0$ information bits are input, and the output bits are ignored. After N cycles the encoder is in the state $x_{[zs],N}$. We can calculate the corresponding initial state $x_0$ using (4) and initialize the encoder accordingly.

The second state is the actual encoding. The encoder starts in the correct initial state $x_0$; the information vector u is input and a valid codeword v results.

In one embodiment of the invention the precomputed solutions to (4) for the desired frame size N (or sizes) can be stored in a look-up table.

FIG. 8 is a block diagram of a turbo decoder configured in accordance with one embodiment of the invention. After transmission through a channel (which typically introduces errors) the resulting receive samples for a frame of data are stored in memory bank 800. Memory bank 800 is typically random access memory, and is typically double buffered so that one frame of data can be decoded while another frame is being received.

For higher order modulation schemes the samples are preferably stored and converted to log-likelihood ratios (LLR) during each decoding as described in U.S. patent application Ser. No. 60/256,890 entitled "Reduced Memory Storage in an Iterative Decoder" and filed on Dec. 18, 2000, now abandoned, assigned to the assignee of the present invention and incorporated herein by reference in its entirety.

During decoding, a first subiteration (in accordance with the first constituent code of the turbo code) is performed the LLR values (either stored or calculated on the fly from the samples) are fed through sum circuit 802 to log-MAP decoder 804. The use of log-MAP decoder 802 is generally preferred as it provides excellent performance with reduced complexity, however, other types of soft-in-soft-out (SISO) decoders may be employed.

During the first decoding iteration, sum circuit 802 simply passes the LLR values to log-MAP decoder 804. The resulting extrinsic information from log-MAP decoder 804 is stored in extrinsic information memory 806.

In an embodiment of the invention in which tail biting is employed, log-MAP decoder will receive the end of the frame of data to be decoded before beginning to decode at the start of the frame. By decoding the end of the frame first, the encoder will be placed in the start state used during the original decoding as the start state and finish state are the same. This "warm up" should be used during each iteration for which the corresponding constituent code employs tail biting.

Once the first iteration has been completed a second subiteration is performed (in accordance with the second constituent code of the turbo code) by summing the extrinsic information from extrinsic information memory 806 with the corresponding LLRs from sample memory 800. The resulting "corrected" LLR values are fed to the log-MAP decoder 804. (Where constituent codes having different parameters are used, log-MAP decoder should be configurable or multiple instantiations should be used.)

The extrinsic information is read from extrinsic information memory 806 using address generator 808. Address generator 808 generates interleaved addresses using seed values from seed read-only-memory (ROM) 810 in accordance with the above described interleaver generation schemes. Thus, the extrinsic information is read out in interleaved order to be combined with the interleaved samples within sample memory 800.

Log-MAP decoder 804 decodes the corrected LLR values generating new extrinsic information that is stored within extrinsic information memory 806. This extrinsic information is used during the next subiteration (which for a 2 constituent code based turbo code will typically correspond to the first constituent code) where it is summed with the LLR values and then decoded again by log-MAP decoder 806. During this second iteration the extrinsic information is read out using counter 808 and therefore in non-interleaved order.

FIG. 9 is a flow chart illustrating the generation of the interleaver addresses in accordance with one embodiment of the invention. The interleaver generation process begins at step 900, and at step 902 the first set of n addresses are calculated based on the seed values. Typically, the seed values are in fact the first set of addresses, but the seed values may also be used indirectly to calculate the first set of addresses.

Once the first set of addresses have been calculated the next set of addresses are calculated at step 904 based on the previous set, which in this case is the first set. As described above, calculating the next set of addresses typically involves adding an increment value to the previous set of addresses, although other calculation methods are consistent with the use of the invention.

Once the next set of addresses are calculated at step 904, it is determined at step 906 if the entire interleaver has been generated. If not, step 904 is performed again and the next set of addresses are calculated based on the previous set of addresses. If the entire interleaver has been generated, then the generation process ends at step 908.

The above described coding scheme provides excellent forward error correction performance including improved error floor performance with reduced circuit area due to the use of generatable interleavers having an excellent combination of spreading and randomness properties. Additionally, some embodiments of the invention allow for a wide range of interleaver sizes, which is beneficial when interfacing with other systems or standards that have particular requirements.

Particularly good performance is achieved with a code that combines the described interleavers with tail bitten (or terminated) rate ½ codes. The rate ½ codes can be a varying states depending on the level of performance required, but the use of a 2 constituent codes in the parallel concatenation (PCCC) scheme described herein gives a highly desirable error floor with 16 state constituent codes (four memory elements). For example, a PCCC using a generatable interleaver as described above and 16 state rate ½ constituent codes can provide better than 10e−10 bits/sec (BER) performance in a rate ⅔ turbo code employing 8PSK modulation. A BER of 10e−10 is minimum requirement for many applications including video broadcast.

The above described codes can also be used within Turbo Codes described in co-pending U.S. provisional patent application Ser. No. 60/202,337 entitled "Improved Error Floor Turbo Codes" incorporated herein by reference in its entirety. As described in that patent, high performance interleavers are generated using three or more constituent codes and two or more interleavers.

In accordance with this embodiment of the invention, at least one of the interleavers used in the code is a highly randomized generatable interleaver configured in accordance with the interleaver generation principals set forth in the high spread patent.

In another embodiment of the invention, both interleavers are highly randomized generatable interleavers configured in accordance with the interleaver generation principals set forth in the high spread patent. In this embodiment of the invention, some particularly good combinations exist.

In a first combination, two interleavers of size n*m, where m=2n are used. In accordance with the interleaver generation techniques set forth in the high spread patent, one interleaver is defined by a set of n seed values to which a value is repeatedly added to generate the remaining addresses and the interleaver is defined by a set of n seed values to which a value is repeatedly subtracted to generate the remaining addresses. Preferably each interleaver is also dithered as described in the high spread patent. Simulation has shown that this interleaver combination works well with a turbo code comprised of two 8 state codes and one 4 state code, although performance with many other codes is also very good.

In a second combination, one interleaver is comprised of an interleaver of size n*m where m is at least larger than m and preferably 2m. The interleaver is then constructed by adding (or subtracting) n to the set of seed values. The second interleaver is size n*m, where m is less than m, however. Thus the second interleaver will have a smaller spread and increased randomness with respect to the first interleaver. This combination of a highly spread less random interleaver with a more random less spread interleaver produces excellent results, particularly with may lower complexity code combinations.

For example, when combined with a very simple code comprised of all four state constituent codes, this interleaver combination can achieve bit error rates as low as 10e−10 for a rate ⅔ 8psk code for frame size of >10,000 bits. Achieving error rates this low using very simple constituent codes and generated interleavers provides a highly efficient and economical coding scheme that will allow the benefits of turbo coding to be incorporated into many applications.

To support local area network traffic that may include audio and video it is useful to have packet sizes such as 4608, 4160 information bits for data traffic, and a 128 bit packet for control information. To implement these frame sizes with a Turbo Codes that use a duo-binary constituent codes, which process two bits per cycle, interleavers of sizes 2304, 2080 and 64 addresses are required.

To form an interleaver with 2304 addresses in accordance with one embodiment of the invention an interleaver that uses the nm method of generation may be employed. For a 2304 address interleaver both n and m may be equal to 48. Additionally, set_step may also be equal to 48. For a 2080 address interleaver n may be equal to 40, m equal to 52 and set_step equal to 40. For a 64 address interleaver, n, m and set step are equal to 8.

In one embodiment of the invention, the interleavers are generated by subtracting set_step from the set of seeds, with numbers less than 0 wrapping around modulo the total address space (2304, 2080, 1506 or 64 addresses in the exemplary cases).

Table VI shows the seeds for the three interleavers described herein.

TABLE VI

Interleaver Seed Table Values

| Location | 2304 | 2080 | 1056 | 64 |
|---|---|---|---|---|
| 0 | 1339 | 1558 | 329 | 54 |
| 1 | 809 | 1239 | 460 | 23 |
| 2 | 1434 | 315 | 679 | 61 |
| 3 | 183 | 1114 | 194 | 12 |
| 4 | 863 | 437 | 807 | 35 |
| 5 | 2301 | 956 | 105 | 2 |
| 6 | 478 | 871 | 762 | 40 |
| 7 | 1668 | 790 | 632 | |
| 8 | 1772 | 833 | 848 | |
| 9 | 1477 | 1152 | 57 | |
| 10 | 38 | 147 | 362 | |
| 11 | 2104 | 506 | 143 | |
| 12 | 226 | 589 | 887 | |
| 13 | 275 | 388 | 710 | |
| 14 | 1611 | 1584 | 272 | |
| 15 | 989 | 265 | 581 | |
| 16 | 2188 | 981 | 401 | |
| 17 | 1513 | 220 | 223 | |
| 18 | 1952 | 1183 | 926 | |
| 19 | 1135 | 102 | 488 | |
| 20 | 2145 | 1258 | 1 | |
| 21 | 1080 | 1019 | 528 | |
| 22 | 1038 | 1296 | | |
| 23 | 1706 | 737 | | |
| 24 | 1169 | 694 | | |
| 25 | 880 | 1495 | | |
| 26 | 1794 | 612 | | |
| 27 | 1220 | 453 | | |
| 28 | 637 | 1049 | | |
| 29 | 1269 | 1450 | | |
| 30 | 407 | 531 | | |
| 31 | 1366 | 47 | | |
| 32 | 732 | 1368 | | |
| 33 | 59 | 645 | | |
| 34 | 115 | 166 | | |

TABLE VI-continued

| | Interleaver Seed Table Values | | | |
|---|---|---|---|---|
| Location | 2304 | 2080 | 1056 | 64 |
| 35 | 591 | 322 | | |
| 36 | 494 | 1323 | | |
| 37 | 1541 | 1404 | | |
| 38 | 920 | 0 | | |
| 39 | 537 | 881 | | |
| 40 | 337 | | | |
| 41 | 2018 | | | |
| 42 | 298 | | | |
| 43 | 672 | | | |
| 44 | 1971 | | | |
| 45 | 1830 | | | |
| 46 | 2215 | | | |
| 47 | 1876 | | | |

The three columns in Table VI contain the seeds used to generate three exemplary interleavers. To generate the next set of n addresses the value set_step as specified above is subtracted from the seeds. Additional sets of n addresses are then generated by subtracting set step from the previous set of n addresses until the complete interleaver has been generated. In an alternative embodiment of the invention set_step could be added, rather than subtracted, to get each new set of addresses.

For example, for the 2304 address interleaver the first 48 address are the set of seeds specified in Table VI. The next 48 address are the set of seeds minus set_step module the frame size (2304). For example, address number 58 (starting with index 0) is (38−48)+2304=2994. The 2304 is added to perform the module-2994 underflow operation. For purposes of this application modulo include modulo underflow operations as described in this paragraph unless expressly stated otherwise.

Table VII shows some properties regarding the seeds used in the 64 address embodiment of the invention described herein.

TABLE VII

| | Seed Property Table | | |
|---|---|---|---|
| Location | Modulo-n (8) | n-multiple (8) | Seed |
| 0 | 6 | 6 | 54 |
| 1 | 7 | 2 | 23 |
| 2 | 5 | 7 | 61 |
| 3 | 4 | 1 | 12 |
| 4 | 3 | 4 | 35 |
| 5 | 2 | 0 | 2 |
| 6 | 0 | 5 | 40 |
| 7 | 1 | 3 | 25 |

As shown in Table VII, in the one embodiment of the invention the seeds are comprised of a set of values each with a unique modulo-n value and n-multiple value. The modulo n-value is kept close to natural descending order location of the seed with some shuffling to increase overall randomness. In the described embodiment these properties are common to the three sets of seeds shown in Table VI.

In the example 8 seed case, only one pair of modulo-n values are shuffled to increase randomness. In one embodiment of the invention an ascending order of modulo-n values may be used.

It is also preferable to incorporate the tail biting described above for one or more of the constituent codes described above.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A method for generating an interleaver for use in a Turbo Code comprising:
    a) setting a first set of 48 addresses to a corresponding set of seed values;
    b) subtracting 48 from each value in the previous set of 48 addresses, modulo 2304, thereby generating a next set of 48 addresses; and
    c) repeating step b) until 2304 addresses have been generated.

2. A method for generating an interleaver for use in a Turbo Code comprising:
    a) setting a first set of 40 addresses to a corresponding set of seed values;
    b) subtracting 40 from each value in the previous set of 40 addresses, modulo 2080, thereby generating a next set of 40 addresses; and
    c) repeating step b) until 2080 addresses have been generated.

3. A method for generating an interleaver for use in a Turbo Code comprising:
    a) setting a first set of 22 addresses to a corresponding set of seed values;
    b) subtracting 22 from each value in the previous set of 22 addresses, modulo 1056, thereby generating a next set of 22 addresses; and
    c) repeating step b) until 1056 addresses have been generated.

4. A method for generating an interleaver for use in a Turbo Code comprising:
    a) setting a first set of 8 addresses to a corresponding set of seed values;
    b) subtracting 8 from each value in the previous set of 8 addresses, modulo 64, thereby generating a next set of 8 addresses; and
    c) repeating step b) until 64 addresses have been generated.

5. A circuit for generating an interleaver of size N comprising:
    a memory ROM operable to store a set of seed values; and
    a subtraction circuitry operable to generate a next set of addresses by subtracting a predetermined value from each address in a previous set of addresses, wherein a first set of addresses is based on said set of seed values, and wherein the subtraction circuitry is operable to subtract according to a modulo index.

6. The circuit as set forth in claim 5, wherein said set of seed values are the values set forth in column 2 of Table VI.

7. The circuit as set forth in claim 5, wherein said set of seed values are the values set forth in column 3 of Table VI.

8. The circuit as set forth in claim 5, wherein said set of seed values are the values set forth in column 4 of Table VI.

9. The circuit as set forth in claim 5, wherein said set of seed values are the values set forth in column 5 of Table VI.

10. The circuit as set forth in claim 5, wherein the first set of addresses is equal to said set of seed values.

11. A method for generating an interleaver of a specified size for use in a Turbo Code comprising:
   a) setting a first plurality of addresses according to a plurality of seed values;
   b) subtracting a predetermined value from each address in the previous plurality of addresses, thereby generating a next plurality of addresses, wherein the subtracting is limited by a modulo index; and
   c) repeating step b) until the total number of addresses reaches the specified size.

12. The method of claim 11, wherein the values of the first plurality of addresses are equal to the plurality of seed values.

* * * * *